(12) United States Patent
Davarpanah et al.

(10) Patent No.: US 11,921,170 B2
(45) Date of Patent: Mar. 5, 2024

(54) PROTECTION OF LOW-VOLTAGE DISTRIBUTION NETWORKS

(71) Applicants: Mahdi Davarpanah, Tehran (IR); Ahmadreza Darabi, Tehran (IR); Pooria Allah Karami, Tehran (IR); Hamed Morsali, Tehran (IR)

(72) Inventors: Mahdi Davarpanah, Tehran (IR); Ahmadreza Darabi, Tehran (IR); Pooria Allah Karami, Tehran (IR); Hamed Morsali, Tehran (IR)

(73) Assignees: ELECTRONIC SAZAN FAN ARIA COMPANY, Tehran (IR); Mahdi Davarpanah, Tehran (IR)

( * ) Notice: Subject to any disclaimer, the term of this patent is extended or adjusted under 35 U.S.C. 154(b) by 61 days.

(21) Appl. No.: 17/721,893

(22) Filed: Apr. 15, 2022

(65) Prior Publication Data

US 2022/0236339 A1    Jul. 28, 2022

Related U.S. Application Data

(63) Continuation-in-part of application No. PCT/IB2022/051490, filed on Feb. 19, 2022.

(51) Int. Cl.
*H02H 3/34* (2006.01)
*G01R 31/62* (2020.01)
*H02H 3/16* (2006.01)
*H02H 7/04* (2006.01)

(52) U.S. Cl.
CPC ............. *G01R 31/62* (2020.01); *H02H 3/165* (2013.01); *H02H 3/343* (2013.01); *H02H 7/042* (2013.01)

(58) Field of Classification Search
CPC .... G01R 31/086; G01R 31/08; G01R 31/088; G01R 31/085; G01R 31/52; G01R 31/62; H02H 3/165; H02H 3/081; H02H 3/402; H02H 7/26; H02H 9/08
See application file for complete search history.

(56) References Cited

U.S. PATENT DOCUMENTS

2013/0279048 A1* 10/2013 Juha ........................ H02H 7/045
361/36
2021/0334441 A1* 10/2021 Wu ......................... H02H 3/006

* cited by examiner

*Primary Examiner* — Bryan R Perez
(74) *Attorney, Agent, or Firm* — Bajwa IP Law Firm; Haris Zaheer Bajwa

(57) ABSTRACT

A method for protecting a low-voltage distribution network. The low-voltage distribution network includes a low-voltage side of a three-phase distribution transformer that is configured to supply electrical power to at least one single-phase load through a respective distribution line of a plurality of three-phase distribution lines distribution lines. The method includes measuring variations of a periodic neutral-to-ground voltage between a neutral terminal of the three-phase distribution transformer and a local ground node by sampling the variations at a sampling frequency, detecting a fault in the low-voltage power distribution network based on the variations of the periodic neutral-to-ground voltage, and disconnecting the low-voltage side from the low-voltage power distribution network responsive to the fault being detected.

14 Claims, 10 Drawing Sheets

PROTECTION OF LOW-VOLTAGE DISTRIBUTION NETWORKS

CROSS-REFERENCE TO RELATED APPLICATION

This application is a continuation-in-part of International Patent Application PCT/IB2022/051490, filed on Feb. 19, 2022, and entitled "PROTECTION OF LOW-VOLTAGE DISTRIBUTION NETWORKS," which is incorporated herein by reference in its entirety.

TECHNICAL FIELD

The present disclosure generally relates to electric power systems, and particularly, to low-voltage distribution networks.

BACKGROUND

Low-voltage distribution networks may utilize relatively long outgoing feeders, which may increase the possibility of fault occurrence along such feeders. Exemplary faults that may occur in low-voltage networks include loss of neutral conductor (i.e., a break in a neutral conductor of a feeder), feeder phase to ground fault (i.e., fall of a conductor of a feeder to the ground), and a phase to ground fault in low-voltage windings of distribution transformers. Some low-voltage distribution networks may employ multiple-grounded systems (by grounding neutral conductors at several different places along outgoing feeders) to decrease neutral to ground resistance. As a result, a considerable amount of electric current may flow through local ground nodes when one of the previously mentioned faults occurs, causing a significant increase in a neutral to ground voltage (i.e., a voltage between a neutral conductor and the ground). Such an increase in a neutral to ground voltage may be harmful to humans and electrical equipment connected to the low-voltage network.

Conventional low-voltage distribution systems utilize protection relays such as molded case circuit breakers (MCCBs) or air circuit breakers (ACBs) for protection. The MCCBs and ACBs generally detect system faults by monitoring phase and neutral currents. However, such circuit breakers typically compare amplitudes of the currents with thresholds which are usually adjusted significantly larger than levels of electric current changes caused by the loss of neutral conductor or the phase to ground faults.

Earth leakage circuit breakers may also be used for low-voltage distribution protection. Such devices may detect leakage currents flowing to the ground by measuring all phase and neutral currents. A leakage current may be detected if sum of the measured currents is non-zero. However, unbalanced phase loads may also cause a leakage current in multiple-grounded systems. In addition, global or local saturation of at least one current transformer, which is employed in low-voltage sides of distribution transformers to measure currents passing through phases and neutral conductors, may distort current waveforms of saturated current transformers. Therefore, global or local saturation of a current transformer may increase a resulted sum of the phases and neutral currents as compared with an actual current passing through the ground. Therefore, earth leakage circuit breakers should be set to a threshold above a maximum measuring leakage current under unbalanced load conditions by considering the current transformer saturation phenomenon. Unfortunately, zero-sequence currents caused by loss of neutral and phase to ground faults may fall below the set threshold. As a result, earth leakage circuit breakers may have limited capability for detecting loss of neutral and/or phase to ground faults.

There is, therefore, a need for a method and a system for protecting low-voltage distribution networks from loss of neutral conductor and phase to ground faults. There is also a need for a method and a system that may distinguish loss of neutral and phase to ground faults from load unbalance in low-voltage distribution networks.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure is directed to an exemplary method for protecting a low-voltage distribution network. An exemplary low-voltage distribution network may include a low-voltage side of a three-phase distribution transformer that may be configured to supply electrical power to at least one single-phase load through a respective distribution line of a plurality of three-phase distribution lines. An exemplary method may include measuring variations of a periodic neutral-to-ground voltage between a neutral terminal of the three-phase distribution transformer and a local ground node by sampling the variations at a sampling frequency, detecting a fault in the low-voltage distribution network based on the variations of the periodic neutral-to-ground voltage, and disconnecting the low-voltage side of the three-phase distribution transformer from the low-voltage distribution network responsive to the fault being detected.

In an exemplary embodiment, measuring the variations of the periodic neutral-to-ground voltage may include measuring a first voltage phasor of the periodic neutral-to-ground voltage at a first moment and measuring a second voltage phasor of the periodic neutral-to-ground voltage at a second moment that may be larger than the first moment. An exemplary first voltage phasor may include a first voltage amplitude and a first voltage phase. An exemplary second voltage phasor may include a second voltage amplitude and a second voltage phase. In an exemplary embodiment, measuring the second voltage phasor at the second moment may include measuring the second voltage phasor after at least 10 temporal periods of the periodic neutral-to-ground voltage from the first moment.

In an exemplary embodiment, measuring the variations of the periodic neutral-to-ground voltage may further include obtaining a first compensated voltage phase by compensating the first voltage phase according to a phase of a positive sequence component, obtaining a second compensated voltage phase by compensating the second voltage phase according to the phase of the positive sequence component, and obtaining the variations of the periodic neutral-to-ground voltage based on the first voltage amplitude, the first compensated voltage phase, the second voltage amplitude, and the second compensated voltage phase. An exemplary positive sequence component may be associated with electric currents that may flow through the plurality of three-phase distribution lines.

In an exemplary embodiment, detecting the fault in the low-voltage distribution network may include performing an iterative measurement procedure on the low-voltage distribution network responsive to the variations of the periodic neutral-to-ground voltage being larger than a variation threshold by performing each iteration of the iterative measurement procedure M times at each respective period of the periodic neutral-to-ground voltage where $$M = \frac{F_s}{F_v}$$

where $F_v$ is a frequency of the periodic neutral-to-ground voltage and $F_s$ is the sampling frequency and detecting the fault responsive to the iterative measurement procedure satisfying a fault condition for a predefined number of iterations of the iterative measurement procedure.

In an exemplary embodiment, performing each iteration of the iterative measurement procedure may include measuring a third voltage phasor of the periodic neutral-to-ground voltage at a third moment in a respective period of the periodic neutral-to-ground voltage, obtaining a third compensated voltage phase, obtaining a relative voltage change based on the third voltage phasor and the third compensated voltage phase, measuring a first current phasor of a neutral electric current that may pass through a neutral conductor of the three-phase distribution transformer at the first moment, measuring a second current phasor of the neutral electric current at the third moment, obtaining a first compensated current phase, obtaining a second compensated current phase, obtaining a relative current change based on the first current phasor, the second current phasor, the first compensated current phase, and the second compensated current phase, obtaining a first amplitude of the positive sequence component at the first moment, and obtaining a second amplitude of the positive sequence component at the third moment. An exemplary third voltage phasor may include a third voltage amplitude and a third voltage phase. In an exemplary embodiment, obtaining the third compensated voltage phase may include compensating the third voltage phase according to the phase of the positive sequence component. An exemplary first current phasor may include a first current amplitude and a first current phase. An exemplary second current phasor may include a second current amplitude and a second current phase. In an exemplary embodiment, obtaining the first compensated current phase may include compensating the first current phase according to the phase of the positive sequence component. In an exemplary embodiment, obtaining the second compensated current phase may include compensating the second current phase according to the phase of the positive sequence component.

In an exemplary embodiment, each of compensating the first voltage phase, compensating the second voltage phase, compensating the third voltage phase, compensating the first current phase, and compensating the second current phase may include measuring a first electric current that may pass through a first distribution line of the plurality of three-phase distribution lines, measuring a second electric current that may pass through a second distribution line of the plurality of three-phase distribution lines, measuring a third electric current that may pass through a third distribution line of the plurality of three-phase distribution lines, calculating the positive sequence component based on the first electric current, the second electric current, and the third electric current, and calculating each of the first compensated voltage phase, the second compensated voltage phase, the third compensated voltage phase, the first compensated current phase, and the second compensated current phase based on the phase of the positive sequence component.

In an exemplary embodiment, measuring the first electric current may include reducing a level of the first electric current utilizing a first current transformer. In an exemplary embodiment, measuring the second electric current may include reducing a level of the second electric current utilizing a second current transformer. In an exemplary embodiment, measuring the third electric current may include reducing a level of the third electric current utilizing a third current transformer. In an exemplary embodiment, each of measuring the first current phasor and measuring the second current phasor may include reducing a level of the neutral electric current utilizing a fourth current transformer.

An exemplary method may further include performing the iterative measurement procedure for a period of at least 200 ms responsive to the low-voltage side of the three-phase distribution transformer being disconnected and disconnecting a high-voltage side of the three-phase distribution transformer responsive to the iterative measurement procedure satisfying the fault condition during the period of at least 200 ms.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

The drawing figures depict one or more implementations in accord with the present teachings, by way of example only, not by way of limitation. In the figures, like reference numerals refer to the same or similar elements.

DETAILED DESCRIPTION

Figure 1A:
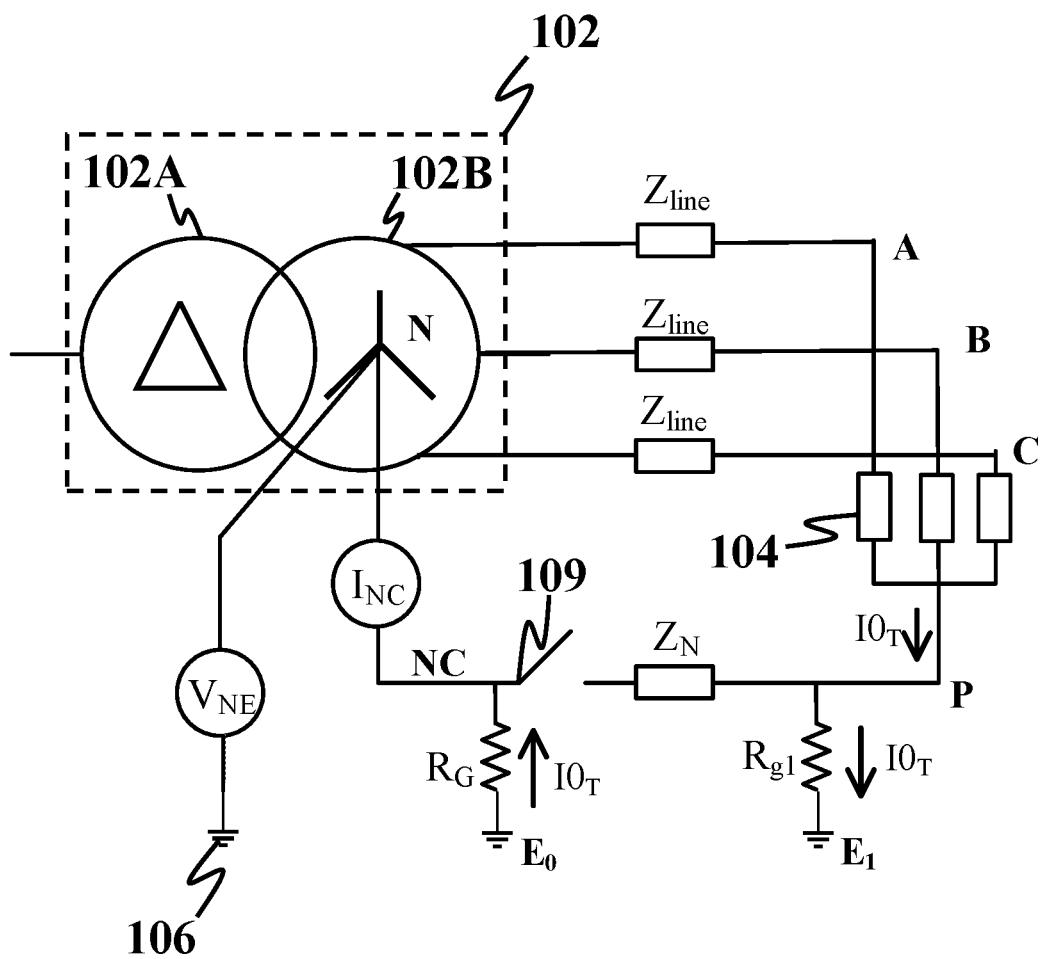
FIG. 1A shows a schematic of a low-voltage distribution network, consistent with one or more exemplary embodiments of the present disclosure.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary method for protecting low-voltage distribution networks. An exemplary method may detect occurrences of faults such as a loss of neutral conductor or a phase to ground fault in a low-voltage distribution system. An exemplary method may continuously monitor variations of a neutral to ground voltage at a secondary side (i.e., low-voltage side) of a distribution transformer that may be coupled to the network. If the variations of the periodic neutral to ground voltage exceed a certain threshold, an exemplary method may proceed to calculating certain electrical parameters of the network. If exemplary electrical parameters satisfy a set of fault conditions for a given period of time, an exemplary method may detect a fault in the low-voltage distribution network. Consequently, an exemplary protection relay may disconnect a low-voltage side of the distribution transformer by issuing a trip command to a circuit breaker that may be coupled to the distribution transformer. If an exemplary fault condition is still satisfied after issuing the trip command, it may be concluded that the phase to ground fault has occurred at the low-voltage winding of the three-phase distribution transformer. Under such a case, an exemplary transformer may be disconnected by issuing a trip command to a circuit breaker at a high-voltage side of the transformer.

FIG. 1A shows a schematic of a low-voltage distribution network, consistent with one or more exemplary embodiments of the present disclosure. In an exemplary embodiment, a "low-voltage distribution network" may refer to a distribution network with that may operate at a voltage level lower than about 1000 volts. An exemplary low-voltage distribution network 100 may include a low-voltage side of a three-phase distribution transformer 102 that may be configured to supply electrical power to at least one single-phase load (for example, load 104 in FIG. 1A) through a respective distribution line (for example, line A in FIG. 1A) of a plurality of three-phase distribution lines A, B, and C. In an exemplary embodiment, the plurality of three-phase distribution lines may also include a neutral conductor, in addition to three-phase distribution lines A, B, and C (for example, line NC in FIG. 1A). In an exemplary embodiment, three-phase distribution transformer 102 may include a primary side (also referred to as a "high-voltage side") 102A and a secondary side (also referred to as a "low-voltage side") 102B. In an exemplary embodiment, windings of secondary side 102B may include a grounded star (yn) or a grounded zigzag (zn) connection. An exemplary common point of the grounded star or the grounded zigzag connection (i.e., the neutral terminal N in FIG. 1A) may be connected to a neutral conductor (for example, line NC in FIG. 1A) to supply single-phase loads.

Figure 2A:
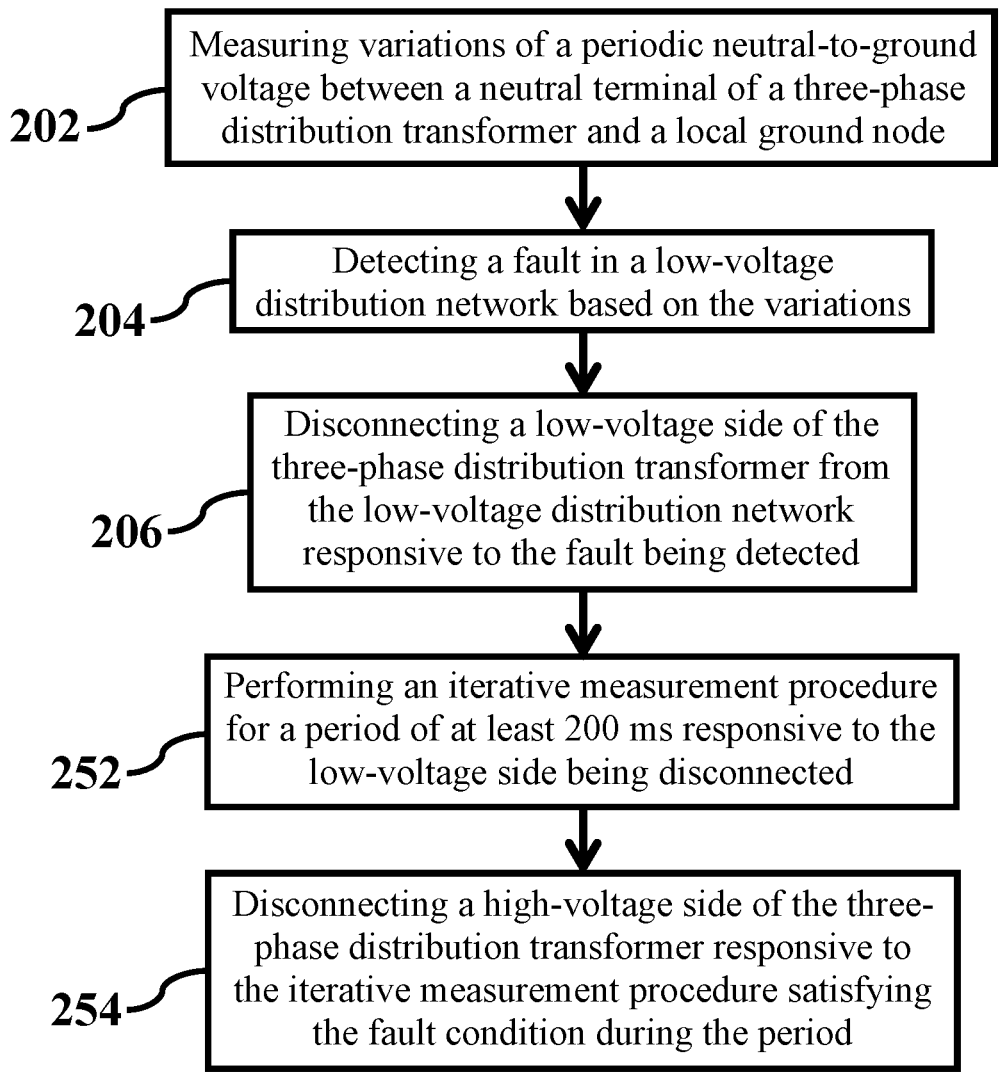
FIG. 2A shows a flowchart of a method for protecting a low-voltage distribution network, consistent with one or more exemplary embodiments of the present disclosure.

FIG. 2A shows a flowchart of a method for protecting a low-voltage distribution network, consistent with one or more exemplary embodiments of the present disclosure. An exemplary method 200 may be utilized for protecting low-voltage distribution network 100. Referring to FIGS. 1A and 2A, in an exemplary embodiment, method 200 may include measuring variations of a periodic neutral-to-ground voltage $V_{NE}$ between a neutral terminal N of three-phase distribution transformer 102 and a local ground node 106 (step 202), detecting a fault in low-voltage distribution network 100 based on the variations of periodic neutral-to-ground voltage $V_{NE}$ (step 204), and disconnecting low-voltage side 102B of three-phase distribution transformer 102 from low-voltage distribution network 100 responsive to the fault being detected (step 206).

Figure 1B:
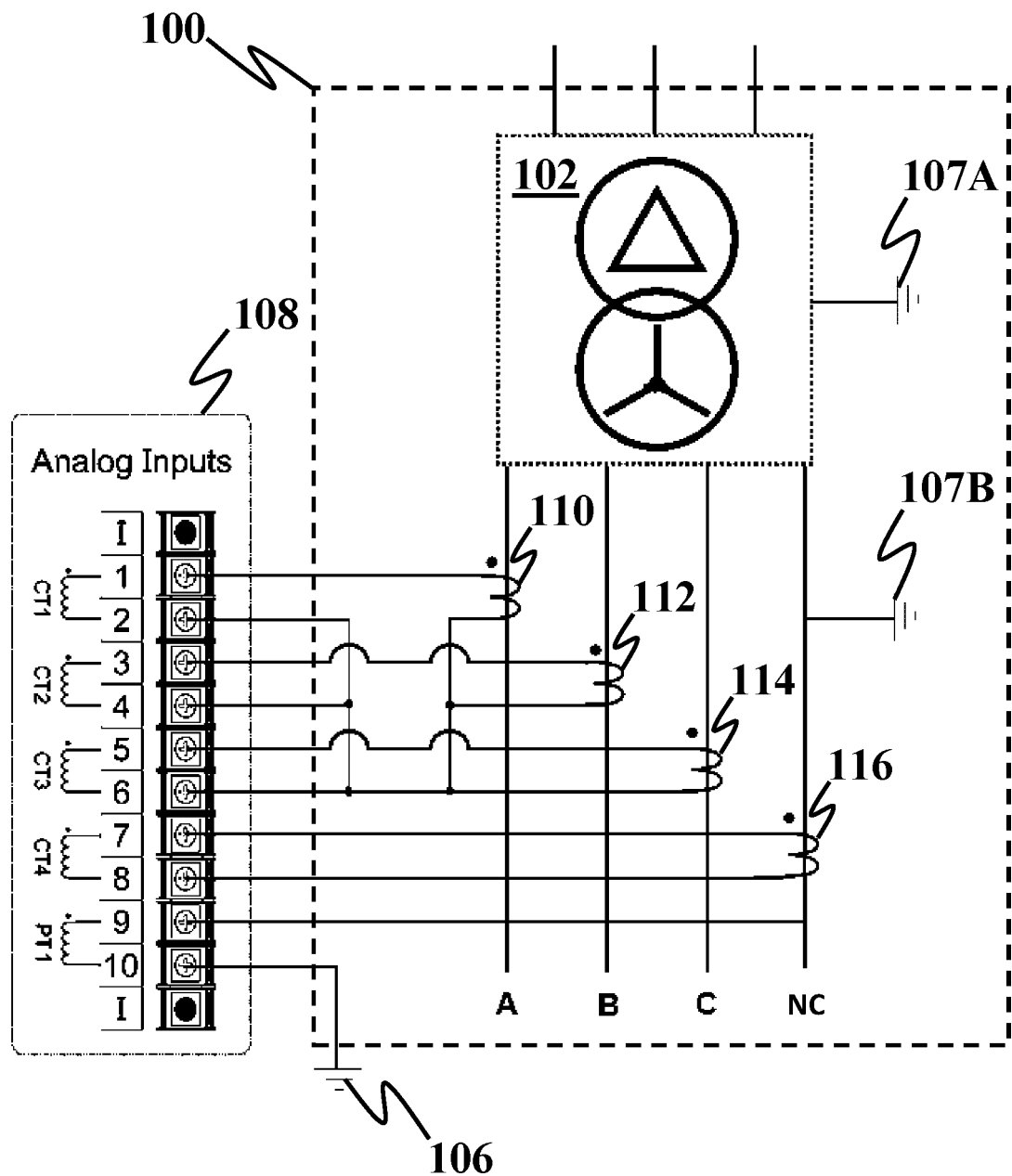
FIG. 1B shows a schematic of a numerical relay coupled to a low-voltage distribution network, consistent with one or more exemplary embodiments of the present disclosure.

FIG. 1B shows a schematic of a numerical relay coupled to a low-voltage distribution network, consistent with one or more exemplary embodiments of the present disclosure. An exemplary numerical relay 108 may be coupled to low-voltage distribution network 100. In an exemplary embodiment, numerical relay 108 may include one or processors that may allow for implementing different steps of method 200.

Referring to FIGS. 1B and 2A, in an exemplary embodiment, step 202 may include measuring the variations of periodic neutral-to-ground voltage $V_{NE}$ between neutral terminal N and local ground node 106. In an exemplary embodiment, numerical relay 108 may be utilized to measure the variations. In an exemplary embodiment, neutral terminal N and local ground node 106 may be connected to nodes 9 and 10 of numerical relay 108, respectively, and the variations of periodic neutral-to-ground voltage $V_{NE}$ may be sampled at a sampling frequency by numerical relay 108 to measure the variations. In an exemplary embodiment, local ground node 106 may be isolated from other ground nodes of low-voltage distribution network 100 (such as nodes 107A and 107B) by connecting local ground node 106 to a ground rod which may be driven deep into the ground.

Referring again to FIG. 1A, in an exemplary embodiment, if a loss of neutral conductor fault occurs in low-voltage distribution network 100 (i.e., a neutral conductor NC is broken at a point 109), loads that are connected to respective ends of current distribution lines A, B, and C may be unbalanced, causing a zero-sequence current $I0_T$ to flow from a ground node $E_1$ to a ground node $E_0$ (instead of neutral conductor NC which is broken). Since exemplary ground resistance (represented by resistors $R_G$ and $Rg_1$ in FIG. 1A) may be significantly higher than neutral conductor resistance (represented by an impedance $Z_N$ in FIG. 1A), the flow of zero-sequence current $I0_T$ through the ground may result in a significant increase (for example, more than 5%) in a magnitude of periodic neutral-to-ground voltage $V_{NE}$. Therefore, in an exemplary embodiment, monitoring variations of periodic neutral-to-ground voltage $V_{NE}$ may lead to detecting the loss of neutral fault.

Figure 2B:
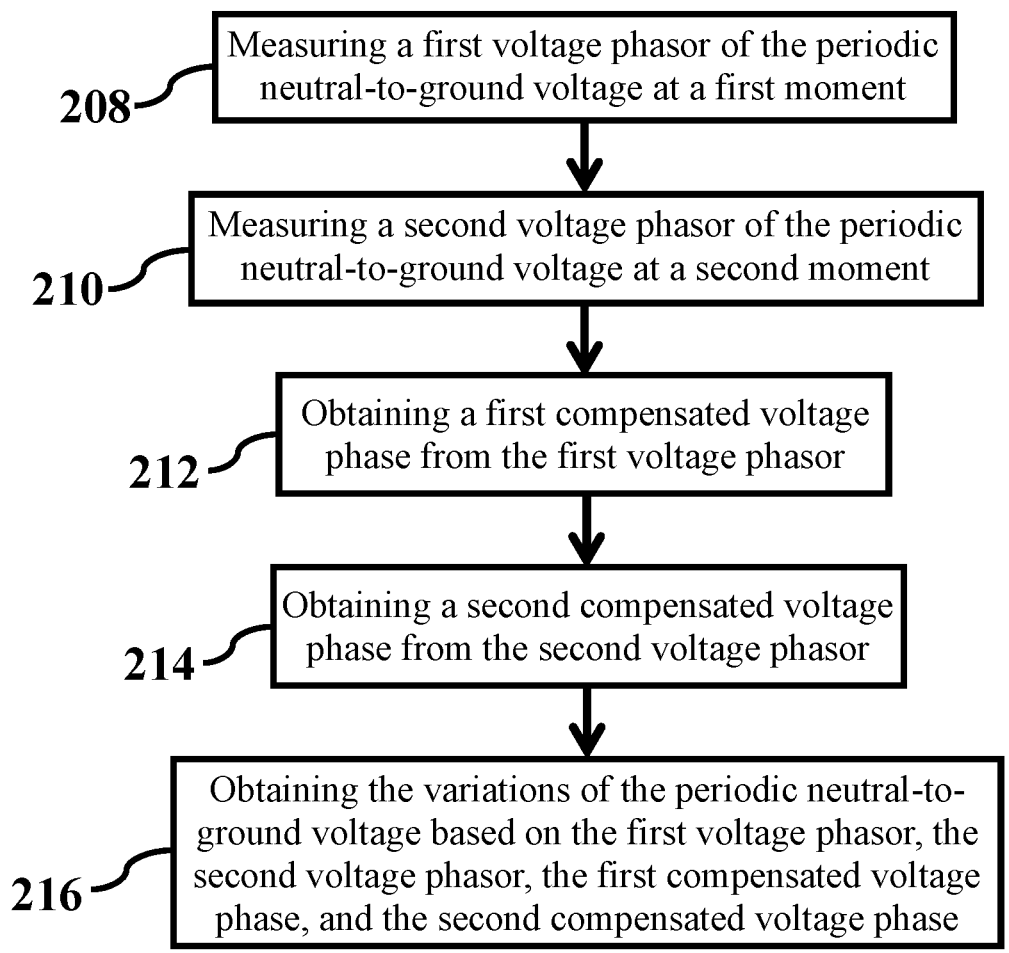
FIG. 2B shows a flowchart for measuring variations of a periodic neutral-to-ground voltage, consistent with one or more exemplary embodiments of the present disclosure.

In further detail with respect to step 202, FIG. 2B shows a flowchart for measuring variations of a periodic neutral-to-ground voltage, consistent with one or more exemplary embodiments of the present disclosure. In an exemplary embodiment, measuring the variations of periodic neutral-to-ground voltage $V_{NE}$ may include measuring a first voltage phasor of periodic neutral-to-ground voltage $V_{NE}$ at a first moment (step 208), measuring a second voltage phasor of periodic neutral-to-ground voltage $V_{NE}$ at a second moment (step 210), obtaining a first compensated voltage phase from the first voltage phasor (step 212), obtaining a second compensated voltage phase from the second voltage phasor (step 214), and obtaining the variations of periodic neutral-to-ground voltage $V_{NE}$ based on the first voltage phasor, the second voltage phasor, the first compensated voltage phase, and the second compensated voltage phase (step 216).

For further detail regarding step 208, in an exemplary embodiment, measuring the first voltage phasor may include measuring a first voltage amplitude and a first voltage phase of periodic neutral-to-ground voltage $V_{NE}$. In an exemplary embodiment, a full cycle Fourier algorithm may be applied to samples of periodic neutral-to-ground voltage $V_{NE}$ to calculate the first voltage amplitude and the first voltage phase.

In further detail with regards to step 210, in an exemplary embodiment, measuring the second voltage phasor at the second moment may include measuring a second voltage amplitude and a second voltage phase of periodic neutral-to-ground voltage $V_{NE}$ at the second moment. An exemplary second moment may be after the first moment. In an exemplary embodiment, a fault or disturbance in low-voltage distribution network 100 may cause irregularities in measurements of periodic neutral-to-ground voltage $V_{NE}$. In an exemplary embodiment, measuring the second voltage phasor at the second moment may include measuring the second voltage phasor after at least 10 temporal periods of periodic neutral-to-ground voltage $V_{NE}$ from the first moment, so that possible irregularities may not affect both measurements of the first and the second voltage phasor. In an exemplary embodiment, a full cycle Fourier algorithm may be applied to samples of periodic neutral-to-ground voltage $V_{NE}$ to calculate the second voltage amplitude and the second voltage phase.

Exemplary first and second voltage phases may vary in time according to a frequency of low-voltage distribution network 100. Therefore, in an exemplary embodiment, an accurate estimation of the first voltage phase and the second voltage phase may require estimating the frequency of low-voltage distribution network 100 with a high precision, which may impose a high computational cost on calculations of method 200. However, if a difference phasor between each exemplary voltage phasor and a reference signal is calculated, exemplary voltage phases may be compensated since a phase angle inaccurate estimation may similarly affect the voltage phasors and the reference signal, thereby being canceled in a resulting compensated phase of the difference phasor.

In an exemplary embodiment, obtaining the first compensated voltage phase in step 212 may include compensating the first voltage phase according to a phase of a positive sequence component. An exemplary positive sequence component may be calculated based on values of electric currents that may flow through the three current distribution lines, as described below. In an exemplary embodiment, obtaining the second compensated voltage phase in step 214 may include compensating the second voltage phase according to the phase of the positive sequence component. In an exemplary embodiment, the positive sequence component may be utilized as a reference signal for compensating the first and the second voltage phases since the positive sequence component may be relatively robust against different faults in low-voltage distribution network 100 (such as loss of neutral and phase to ground faults).

Figure 2C:
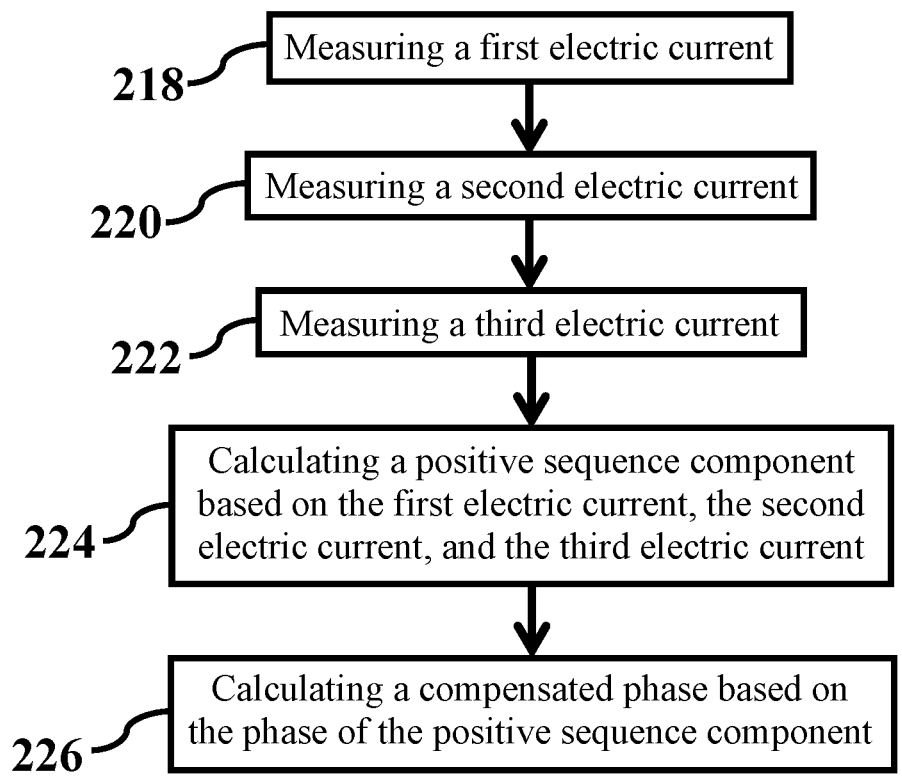
FIG. 2C shows a flowchart of a method for obtaining a compensated phase, consistent with one or more exemplary embodiments of the present disclosure.

For further detail with respect to steps 212 and 214, FIG. 2C shows a flowchart of a method for obtaining a compensated phase, consistent with one or more exemplary embodiments of the present disclosure. An exemplary method 213 may include measuring a first electric current (step 218), measuring a second electric current (step 220), measuring a third electric current (step 222), calculating the positive sequence component based on the first electric current, the second electric current, and the third electric current (step 224), and calculating a compensated phase based on the phase of the positive sequence component (step 226).

Referring again to FIG. 1B, in an exemplary embodiment, step 218 may include measuring the first electric current that may pass through first distribution line A of the plurality of three-phase distribution lines. In an exemplary embodiment, measuring the first electric current may include reducing a level of the first electric current utilizing a first current transformer 110 that may be coupled to numerical relay 108. In an exemplary embodiment, first current transformer 110 may load a reduced level of the first electric current to numerical relay 108 to measure the first electric current. In an exemplary embodiment, numerical relay 108 may apply a full cycle Fourier algorithm to samples of the first electric current to calculate a magnitude and a phase of the first electric current.

In further detail regarding step 220, in an exemplary embodiment, the second electric current may pass through second distribution line B of the plurality of three-phase distribution lines. In an exemplary embodiment, measuring the second electric current may include reducing a level of the second electric current utilizing a second current transformer 112 that may be coupled to numerical relay 108. In an exemplary embodiment, second current transformer 112 may load a reduced level of the second electric current to numerical relay 108 to measure the third electric current. In an exemplary embodiment, numerical relay 108 may apply a full cycle Fourier algorithm to samples of the second electric current to calculate a magnitude and a phase of the second electric current.

For further detail with respect to step 222, in an exemplary embodiment, the third electric current may pass through third distribution line C of the plurality of three-phase distribution lines. In an exemplary embodiment, measuring the third electric current may include reducing a level of the third electric current utilizing a third current transformer 114 that may be coupled to numerical relay 108. In an exemplary embodiment, third current transformer 114 may load a reduced level of the third electric current to numerical relay 108 to measure the third electric current. In an exemplary embodiment, numerical relay 108 may apply a full cycle Fourier algorithm to samples of the third electric current to calculate a magnitude and a phase of the third electric current.

For further detail regarding step 224, in an exemplary embodiment, the positive sequence component may be calculated according to an operation defined by the following:

$$\overline{I_1} = \frac{\overline{I_A} + \alpha \overline{I_B} + \alpha^2 \overline{I_C}}{3} \quad \text{Equation (1)}$$

where $\overline{I_1}$ is a phasor of the positive sequence component, $\overline{I_A}$ is a phasor of the first electric current, $$\alpha = e^{j\frac{2\pi}{3}}$$

where j is the imaginary unit, $\overline{I_B}$ is a phasor of the second electric current, and $\overline{I_C}$ a phasor of is the third electric current.

In further detail with regards to step 226, an exemplary compensated phase may be calculated according to an operation defined by the following:

$$\phi_{NE} = \phi_{NE0} - \phi_{I1} \quad \text{Equation (2)}$$

where $\phi_{NE0}$ represents an exemplary uncompensated phase (such as the first voltage phase or the second voltage phase), $\phi_{I1}$ is the phase of the positive sequence component, and $\phi_{NE}$ is a compensated phase (for example, the first compensated voltage phase or the second compensated voltage phase) that may correspond to $\phi_{NE0}$.

Referring again to FIG. 2B, in an exemplary embodiment, step 216 may include obtaining the variations of periodic neutral-to-ground voltage $V_{NE}$ according to an operation defined by the following:

$$\overline{\Delta V_{NE\text{-}pu}} = \frac{\overline{V_{NE2}} - \overline{V_{NE1}}}{0.5 \times (\overline{V_{NE1}} + \overline{V_{NE2}})} \times 100 \quad \text{Equation (3)}$$

where $\overline{\Delta V_{NE\text{-}pu}}$ represents the variations of periodic neutral-to-ground voltage $V_{NE}$, $\overline{V_{NE1}} = V_{NE1} \angle \phi_{NE1}$ where $V_{NE1}$ is the first voltage amplitude, $\angle$ is the angle symbol, and $\phi_{NE1}$ is the first compensated voltage phase, and $\overline{V_{NE2}} = V_{NE2} \angle \phi_{NE2}$ where $V_{NE2}$ is the second voltage amplitude and $\phi_{NE2}$ is the second compensated voltage phase.

Figure 2D:
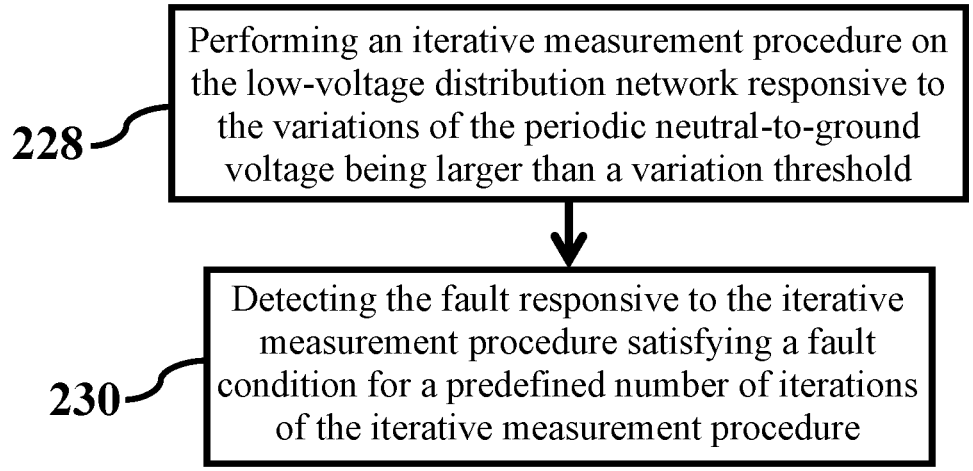
FIG. 2D shows a flowchart for detecting a fault in a low-voltage distribution network, consistent with one or more exemplary embodiments of the present disclosure.

Referring again to FIGS. 1A and 2A, in an exemplary embodiment, step 204 may include detecting the fault in low-voltage distribution network 100. FIG. 2D shows a flowchart for detecting a fault in a low-voltage distribution network, consistent with one or more exemplary embodiments of the present disclosure. In an exemplary embodiment, detecting the fault in low-voltage distribution network 100 may include performing an iterative measurement procedure on low-voltage distribution network 100 responsive to the variations of periodic neutral-to-ground voltage $V_{NE}$ being larger than a variation threshold (step 228) and detecting the fault responsive to the iterative measurement procedure satisfying a fault condition for a predefined number of iterations of the iterative measurement procedure (step 230).

For further detail with regards to step 228, in an exemplary embodiment, performing an iterative measurement procedure may include performing each iteration of the iterative measurement procedure M times at each respective period of periodic neutral-to-ground voltage $V_{NE}$ where $$M = \frac{F_s}{F_v}$$

where $F_v$ is a frequency of periodic neutral-to-ground voltage $V_{NE}$ and $F_S$ is the sampling frequency of $V_{NE}$. An exemplary variation threshold may be set to about 5%, indicating a significant change in the magnitude of periodic neutral-to-ground voltage $V_{NE}$ which may be a sign of a fault occurrence in low-voltage distribution network 100. Therefore, in an exemplary embodiment, if the variations of periodic neutral-to-ground voltage $V_{NE}$ become larger than about 5%, method 200 may proceed to step 228 to detect possible faults in low-voltage distribution network 100.

Figure 2E:
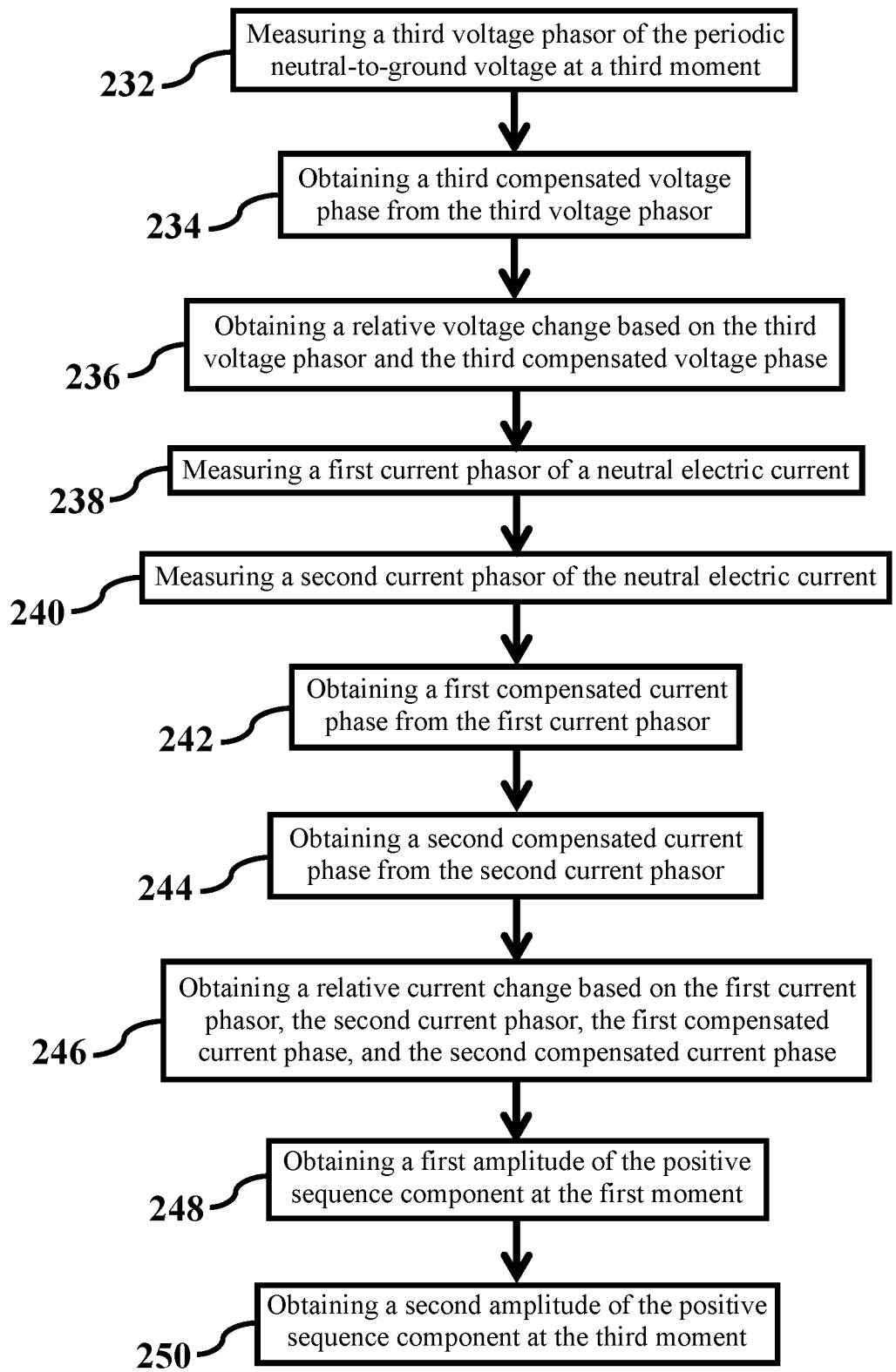
FIG. 2E shows a flowchart for performing each iteration of an iterative measurement procedure, consistent with one or more exemplary embodiments of the present disclosure.

FIG. 2E shows a flowchart for performing each iteration of an iterative measurement procedure, consistent with one or more exemplary embodiments of the present disclosure. In an exemplary embodiment, performing an iteration 228A of the iterative measurement procedure may include measuring a third voltage phasor of periodic neutral-to-ground voltage $V_{NE}$ (step 232), obtaining a third compensated voltage phase from the third voltage phasor (step 234), obtaining a relative voltage change based on the third voltage phasor and the third compensated voltage phase (step 236), measuring a first current phasor of a neutral electric current (step 238), measuring a second current phasor of the neutral electric current (step 240), obtaining a first compensated current phase from the first current phasor (step 242), obtaining a second compensated current phase from the second current phasor (step 244), obtaining a relative current change based on the first current phasor, the second current phasor, the first compensated current phase, and the second compensated current phase (step 246), obtaining a first amplitude of the positive sequence component at the first moment (step 248), and obtaining a second amplitude of the positive sequence component at the third moment (step 250).

For further detail regarding step 232, an exemplary third voltage phasor may be measured at a third moment in a respective period of periodic neutral-to-ground voltage $V_{NE}$. Therefore, in an exemplary embodiment, M voltage phasors may be obtained from periodic neutral-to-ground voltage $V_{NE}$ since step 232 may be repeated M times in step 228. An exemplary third voltage phasor may include a third voltage amplitude and a third voltage phase. In an exemplary embodiment, numerical relay 108 may apply a full cycle Fourier algorithm to samples of periodic neutral-to-ground voltage $V_{NE}$ to calculate the third voltage amplitude and the third voltage phase.

In further detail with respect to step 234, in an exemplary embodiment, obtaining the third compensated voltage phase may include compensating the third voltage phase according to phase $\phi_{f1}$ of the positive sequence component. In an exemplary embodiment, $\phi_{NE0}$ in Equation (2) may be set to the third voltage phase to obtain the third compensated voltage phase in a resulting compensated phase $\phi_{NE}$ according to Equation (2), as described above.

For further detail with regards to step 236, an exemplary relative voltage change may be obtained according to an operation defined by the following:

$$E_V = \frac{\overline{V_{NE3}} - \overline{V_{NE1}}}{0.5 \times (V_{NE1} + V_{NE3})} \times 100 \qquad \text{Equation (4)}$$

where $E_V$ is the relative voltage change, and $\overline{V_{NE3}} = V_{NE3} \angle \phi_{NE3}$ where $V_{NE3}$ is the third voltage amplitude and $\phi_{NE3}$ is the third compensated voltage phase. An exemplary third voltage phasor $V_{NE3}$ may be measured at each iteration of the iterative measurement procedure after detecting that $\overline{\Delta V_{NE-pu}}$ exceeds the variation threshold. An exemplary relative voltage change may show relative changes in the magnitude of periodic neutral-to-ground voltage $V_{NE}$. Since, in an exemplary embodiment, different faults in low-voltage distribution network 100 (such as loss of neutral and phase to ground faults) may cause an increase in the magnitude of periodic neutral-to-ground voltage $V_{NE}$, relative voltage change $E_V$ may be useful for fault detection in low-voltage distribution network 100, as described below under details of step 230.

Referring again to FIGS. 1A and 1B, in an exemplary embodiment, step 238 may include measuring a first current phasor of a neutral electric current $I_{NC}$ that may pass through neutral conductor NC of three-phase distribution transformer 102. An exemplary first current phasor may be measured utilizing numerical relay 108 at the first moment, i.e., simultaneously with measuring the first voltage phasor of periodic neutral-to-ground voltage $V_{NE}$. In an exemplary embodiment, measuring the first current phasor may include reducing a level of neutral electric current $I_{NC}$ utilizing a fourth current transformer 116 that may be coupled to numerical relay 108. In an exemplary embodiment, fourth current transformer 116 may load a reduced level of the neutral electric current to numerical relay 108 to measure the first current phasor. An exemplary first current phasor may include a first current amplitude and a first current phase. In an exemplary embodiment, numerical relay 108 may apply a full cycle Fourier algorithm to samples of neutral electric current $I_{NC}$ to calculate the first current amplitude and the first current phase.

Referring again to FIG. 2E, in an exemplary embodiment, step 240 may include measuring a second current phasor of neutral electric current $I_{NC}$. An exemplary second current phasor may be measured at the third moment, i.e., simultaneously with measuring the third voltage phasor of periodic neutral-to-ground voltage $V_{NE}$. In an exemplary embodiment, measuring the second current phasor may include reducing the level of neutral electric current $I_{NC}$ utilizing fourth current transformer 116. In an exemplary embodiment, fourth current transformer 116 may load a reduced level of the neutral electric current to numerical relay 108 to measure the second current phasor. An exemplary second current phasor may include a second current amplitude and a second current phase. In an exemplary embodiment, numerical relay 108 may apply a full cycle Fourier algorithm to samples of neutral electric current $I_{NC}$ to calculate the second current amplitude and the second current phase.

In further detail with respect to step 242, in an exemplary embodiment, obtaining the first compensated current phase may include compensating the first current phase according to phase $\phi_{f1}$ of the positive sequence component. In an exemplary embodiment, $\phi_{NE0}$ in Equation (2) may be set to the first current phase to obtain the first compensated current phase in a resulting compensated phase $\phi_{NE}$ according to Equation (2), as described above.

For further detail regarding step 244, in an exemplary embodiment, obtaining the second compensated current phase may include compensating the second current phase according to phase $\phi_{f1}$ of the positive sequence component. In an exemplary embodiment, $\phi_{NE0}$ in Equation (2) may be set to the second current phase to obtain the second compensated current phase in a resulting compensated phase $\phi_{NE}$ according to Equation (2), as described above.

For further detail with regards to step 246, an exemplary relative current change may be obtained according to an operation defined by the following:

$$EI = \frac{\overline{I_{NC2}} - \overline{I_{NC1}}}{0.5 \times (I_{NC1} + I_{NC2})} - \times 100 \qquad \text{Equation (5)}$$

where $E_I$ is the relative current change, $\overline{I_{NC1}} = I_{NC1} \angle \phi_{NC1}$ where $I_{NC1}$ is the first current amplitude and $\phi_{NC1}$ is the first compensated current phase, and $\overline{I_{NC2}} = I_{NC2} \angle \phi_{NC2}$ where $I_{NC2}$ is the second current amplitude and $\phi_{NC2}$ is the second compensated current phase. An exemplary relative current change may show the magnitude of relative changes in the phasors of neutral electric current $I_{NC}$ at two different moments. Since, in an exemplary embodiment, different faults in low-voltage distribution network 100 (such as loss of neutral and phase to ground faults) may cause a change in the magnitude and phase of neutral electric current $I_{NC}$, relative current change $E_I$ may be useful for fault detection in low-voltage distribution network 100, as described below.

In an exemplary embodiment, step 248 may include obtaining a first amplitude of the positive sequence component. An exemplary first amplitude $I_1^1$ may be obtained at the first moment, i.e., simultaneously with measuring the first voltage phasor of periodic neutral-to-ground voltage $V_{NE}$. In an exemplary embodiment, first amplitude $I_1^1$ may be obtained by calculating the phasor of the positive sequence component according to Equation (1) and extracting the magnitude of the phasor.

In an exemplary embodiment, step 250 may include obtaining a second amplitude of the positive sequence component. An exemplary second amplitude $I_1^2$ may be obtained at the third moment, i.e., simultaneously with measuring the third voltage phasor of periodic neutral-to-ground voltage $V_{NE}$. In an exemplary embodiment, second amplitude $I_1^2$ may be obtained by calculating the phasor of the positive sequence component according to Equation (1) and extracting the magnitude of the phasor.

Referring again to FIG. 2D, an exemplary fault may be detected in step 230 if the fault condition is satisfied for a predefined number of iterations. An exemplary predefined number of iterations may be set to 3M/2, which is equivalent to about 1.5 cycles of periodic neutral-to-ground voltage $V_{NE}$. As a result, in an exemplary embodiment, transient states of low-voltage distribution network 100 (that may cause disturbances similar to the fault condition) may not mistakenly be interpreted as a fault. In an exemplary embodiment, the fault condition may include one of a first condition, a second condition, or a third condition.

An exemplary first condition may include $|E_I|>3\%$ and $$\left|\frac{E_V}{E_I}\right|>2$$

where $|E_I|$ is an absolute value of the relative current change and $$\left|\frac{E_V}{E_I}\right|$$

is an absolute value of a ratio of $E_V$ to $E_I$. As a result, in an exemplary embodiment, relative changes as low as 3% in the relative current change may be considered a sign of fault occurrence if a magnitude the relative voltage change is at least about twice as large as the magnitude the relative current change. If, in an exemplary embodiment, the ratio of $E_V$ to $E_I$ is smaller than 2, the change in the magnitude of neutral electric current $I_{NC}$ may be due to a disturbance other than a fault (such as a change in a load of low-voltage distribution network 100) and therefore, no fault may be detected based on the first condition.

An exemplary second condition may include $V_{NE3}>V_{th1}$ where $V_{th1}$ is an amplitude threshold for periodic neutral-to-ground voltage $V_{NE}$. An exemplary amplitude threshold may be set to about 0.7 of a largest permissible amplitude of periodic neutral-to-ground voltage $V_{NE}$. In an exemplary embodiment, the largest permissible amplitude of periodic neutral-to-ground voltage $V_{NE}$ may be set to different values (such as 15 and 25 volts for low-voltage systems with nominal phase to ground amplitudes of 110 and 220 volts, respectively). In an exemplary embodiment, an excessive increase of the amplitude of periodic neutral-to-ground voltage $V_{NE}$ may lead to a voltage unbalance in low-voltage distribution network 100 and therefore, it may be considered a sign of fault in low-voltage distribution network 100.

An exemplary third condition may include $\Delta V=|V_{NE3}-V_{NE1}|>V_{th2}$ and $\Delta I=|I_1^2-I_1^1|<I_{th}$ where $V_{th2}$ is a voltage change threshold and $I_{th}$ is a current change threshold. An exemplary voltage change threshold may be set to about 0.4 of the largest permissible amplitude of periodic neutral-to-ground voltage $V_{NE}$. An exemplary current change threshold may be set to about 0.2 of a rated current of three-phase distribution transformer 102. Based on an exemplary third condition, an increase in the magnitude of periodic neutral-to-ground voltage $V_{NE}$ while the magnitude of current positive sequence component is relatively unchanged may be an indication of different faults (such as loss of neutral and phase to ground faults) in low-voltage distribution network 100.

Referring again to FIGS. 1A, 2A, and 2B, in an exemplary embodiment, step 206 may include disconnecting low-voltage side 102B of three-phase distribution transformer 102 from low-voltage distribution network 100 if the fault is detected in low-voltage distribution network 100. In an exemplary embodiment, numerical relay 108 may send a trip command to a switch that may be coupled to a low-voltage side of three-phase distribution transformer 102 to disconnect the switch from low-voltage distribution network 100.

In an exemplary embodiment, method 200 may further include performing the iterative measurement procedure for a period of at least 200 ms responsive to the low-voltage side of three-phase distribution transformer 102 being disconnected (step 252). In an exemplary embodiment, it may last about 200 ms from a moment of issuing the trip command by numerical relay 108 to a moment of disconnecting the low-voltage side by the switch. Therefore, in an exemplary embodiment, the iterative measurement procedure may continue for at least 200 ms to determine whether the fault has been cleared after disconnecting the low-voltage side of three-phase distribution transformer 102.

In an exemplary embodiment, method 200 may further include disconnecting a high-voltage side of three-phase distribution transformer 102 responsive to the iterative measurement procedure satisfying the fault condition during the period of at least about 200 ms (step 252). If an exemplary fault condition is still satisfied after issuing the trip command, it may be determined that an exemplary fault (such as the phase to ground fault) has occurred at a low-voltage winding of three-phase distribution transformer 102. As a result, in an exemplary embodiment, numerical relay 108 may send a trip command to a circuit breaker at a high-voltage side of three-phase distribution transformer 102 to disconnect three-phase distribution transformer 102.

Figure 3:
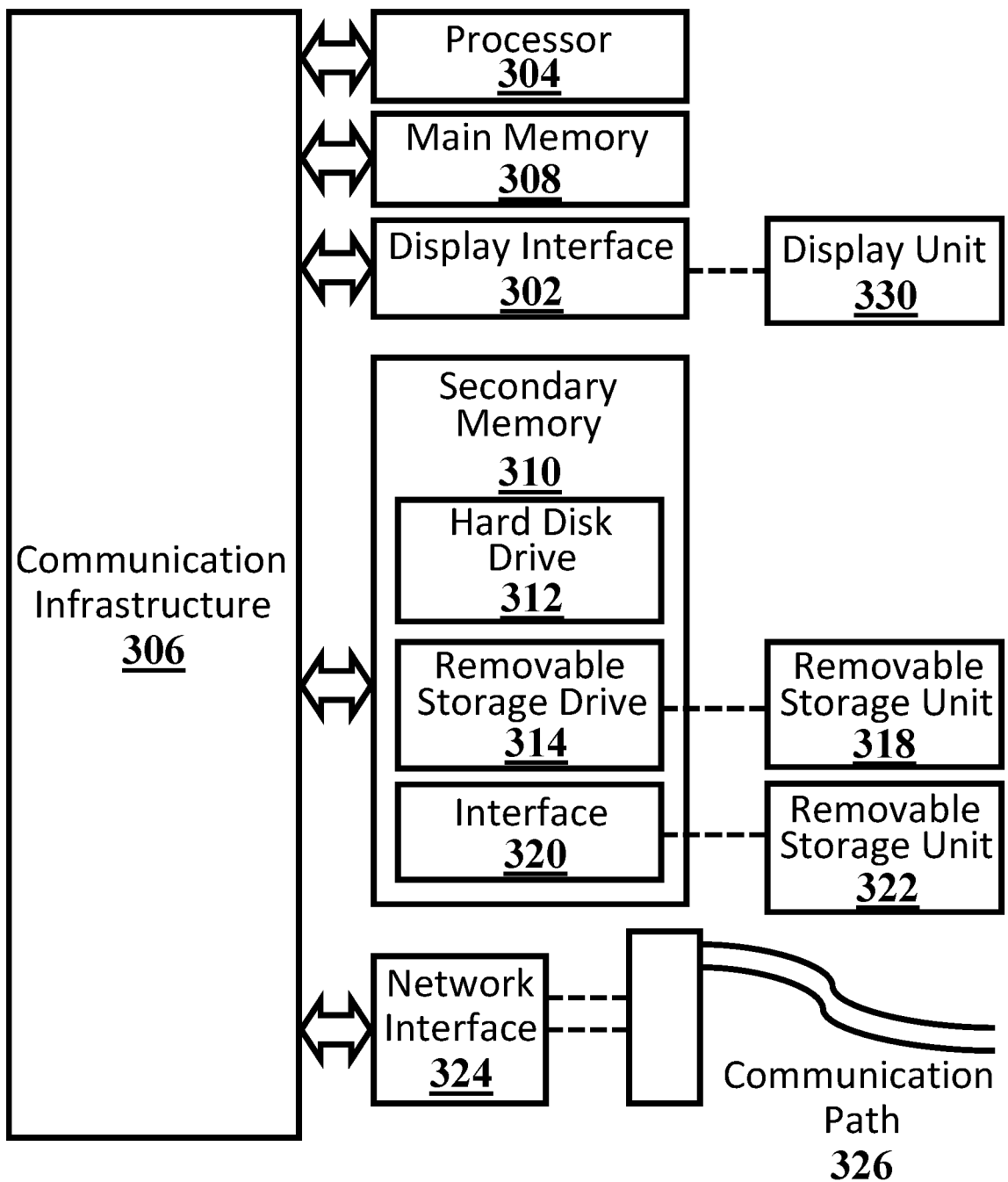
FIG. 3 shows a high-level functional block diagram of a computer system, consistent with one or more exemplary embodiments of the present disclosure.

FIG. 3 shows an example computer system 300 in which an embodiment of the present invention, or portions thereof, may be implemented as computer-readable code, consistent with exemplary embodiments of the present disclosure. For example, different steps of method 200 may be implemented in computer system 300 using hardware, software, firmware, tangible computer readable media having instructions stored thereon, or a combination thereof and may be implemented in one or more computer systems or other processing systems. Hardware, software, or any combination of such may embody any of the modules and components in FIGS. 1B-2E. For example, computer system 300 may embody an implementation of numerical relay 108.

If programmable logic is used, such logic may execute on a commercially available processing platform or a special purpose device. One ordinary skill in the art may appreciate that an embodiment of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer system 300. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multiprocessor machines. In addition, in some embodiments the order of operations may be rearranged without departing from the spirit of the disclosed subject matter.

Processor device 304 may be a special purpose (e.g., a graphical processing unit) or a general-purpose processor device. As will be appreciated by persons skilled in the relevant art, processor device 304 may also be a single processor in a multi-core/multiprocessor system, such system operating alone, or in a cluster of computing devices operating in a cluster or server farm. Processor device 304 may be connected to a communication infrastructure 306, for example, a bus, message queue, network, or multi-core message-passing scheme.

In an exemplary embodiment, computer system 300 may include a display interface 302, for example a video connector, to transfer data to a display unit 330, for example, a monitor. Computer system 300 may also include a main memory 308, for example, random access memory (RAM), and may also include a secondary memory 310. Secondary memory 310 may include, for example, a hard disk drive 312, and a removable storage drive 314. Removable storage drive 314 may include a floppy disk drive, a magnetic tape drive, an optical disk drive, a flash memory, or the like. Removable storage drive 314 may read from and/or write to a removable storage unit 318 in a well-known manner. Removable storage unit 318 may include a floppy disk, a magnetic tape, an optical disk, etc., which may be read by and written to by removable storage drive 314. As will be appreciated by persons skilled in the relevant art, removable storage unit 318 may include a computer usable storage medium having stored therein computer software and/or data.

In alternative implementations, secondary memory 310 may include other similar means for allowing computer programs or other instructions to be loaded into computer system 300. Such means may include, for example, a removable storage unit 322 and an interface 320. Examples of such means may include a program cartridge and cartridge interface (such as that found in video game devices), a removable memory chip (such as an EPROM, or PROM) and associated socket, and other removable storage units 322 and interfaces 320 which allow software and data to be transferred from removable storage unit 322 to computer system 300.

Computer system 300 may also include a communications interface 324. Communications interface 324 allows software and data to be transferred between computer system 300 and external devices. Communications interface 324 may include a modem, a network interface (such as an Ethernet card), a communications port, a PCMCIA slot and card, or the like. Software and data transferred via communications interface 324 may be in the form of signals, which may be electronic, electromagnetic, optical, or other signals capable of being received by communications interface 324. These signals may be provided to communications interface 324 via a communications path 326. Communications path 326 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 318, removable storage unit 322, and a hard disk installed in hard disk drive 312. Computer program medium and computer usable medium may also refer to memories, such as main memory 308 and secondary memory 310, which may be memory semiconductors (e.g. DRAMs, etc.).

Computer programs (also called computer control logic) are stored in main memory 308 and/or secondary memory 310. Computer programs may also be received via communications interface 324. Such computer programs, when executed, enable computer system 300 to implement different embodiments of the present disclosure as discussed herein. In particular, the computer programs, when executed, enable processor device 304 to implement the processes of the present disclosure, such as the operations in method 200 illustrated by flowchart of FIG. 2A discussed above. Accordingly, such computer programs represent controllers of computer system 300. Where an exemplary embodiment of system 100 is implemented using software, the software may be stored in a computer program product and loaded into computer system 300 using removable storage drive 314, interface 320, and hard disk drive 312, or communications interface 324.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nano-technological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

EXAMPLE

Figure 4:
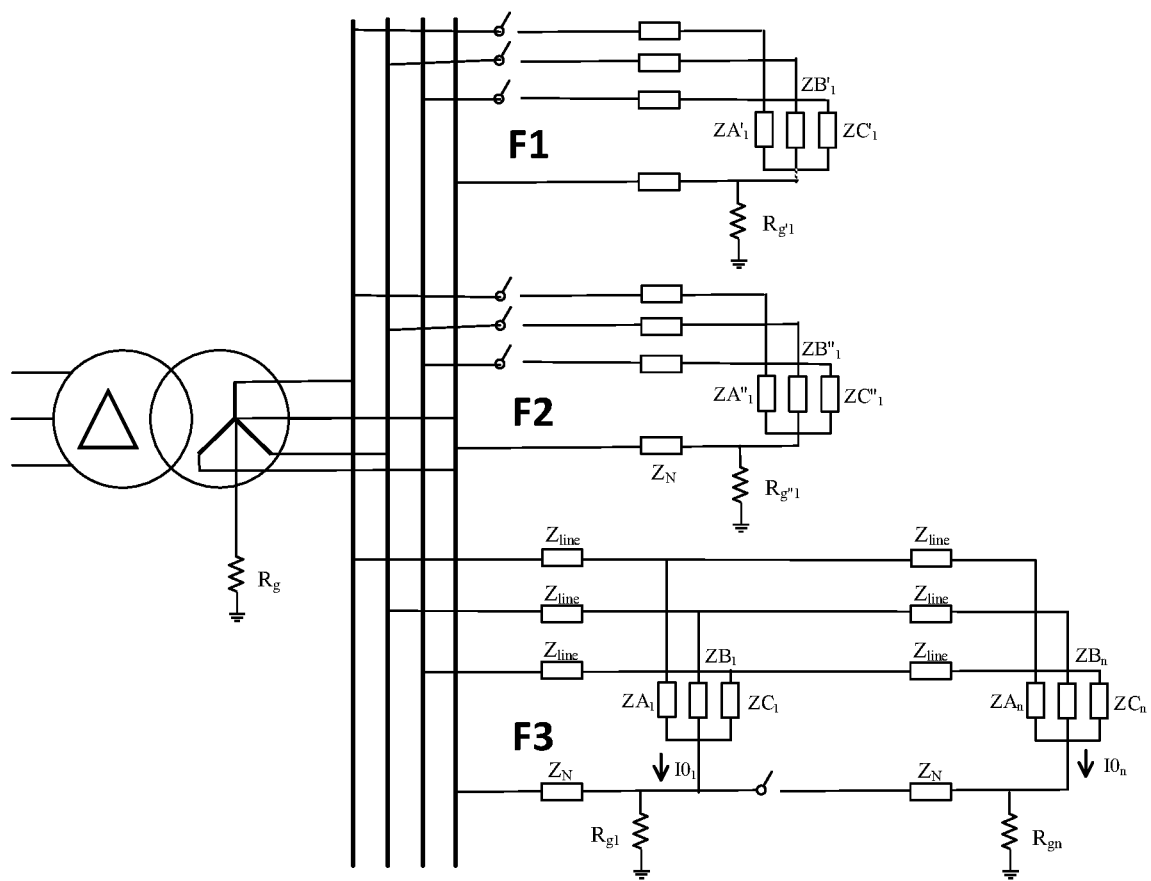
FIG. 4 shows a schematic of a simulated low-voltage distribution network, consistent with one or more exemplary embodiments of the present disclosure.

In this example, performance of an exemplary implementation of method 200 for protecting an exemplary low-voltage distribution network is demonstrated. FIG. 4 shows a schematic of a computer-simulated low-voltage distribution network, consistent with one or more exemplary embodiments of the present disclosure. An exemplary simulated low-voltage distribution network 400 may be similar to low-voltage distribution network 100. Simulated low-voltage distribution network 400 includes three feeders $F_1$, $F_2$, and $F_3$. Each feeder includes three-phase current distribution lines (including distribution lines similar to distribution lines A, B, and C of low-voltage distribution network 100) and a respective neutral conductor (similar to neutral conductor NC of low-voltage distribution network 100). The ground resistance of the neutral conductors of feeders $F_1$ and $F_2$ (represented by resistors $R_{g''1}$ and $R_{g''1}$ are about 15 Ohms.

The neutral conductor of the Feeder $F_3$ is grounded to several local ground nodes, each having a respective ground resistance.

In order to evaluate the performance of simulated low-voltage distribution network 400, several different cases are simulated as follows. Case C1 represents connection of feeder $F_2$ to simulated low-voltage distribution network 400 after 0.3 s from initialization of simulated low-voltage distribution network 400. Case C2 represents connection of feeder $F_1$ to simulated low-voltage distribution network 400 after 0.55 s. Case C3 represents a loss of neutral fault in feeder $F_3$ after 0.8 s. Case C4 represents reconnecting the neutral conductor of feeder $F_3$ after 1.05 s. Case C5 represents disconnecting feeder $F_1$ from simulated low-voltage distribution network 400 after 1.3 s. Case C6 represents a phase to ground fault with a 10 Ohm resistance at the fault point at the end of feeder $F_3$ after 1.55 s. Case C7 represents clearing the phase to ground fault after 1.8 s. Case C8 represents a loss of neutral fault in the entire simulated low-voltage distribution network 400 after 2.05 s.

Figure 5:
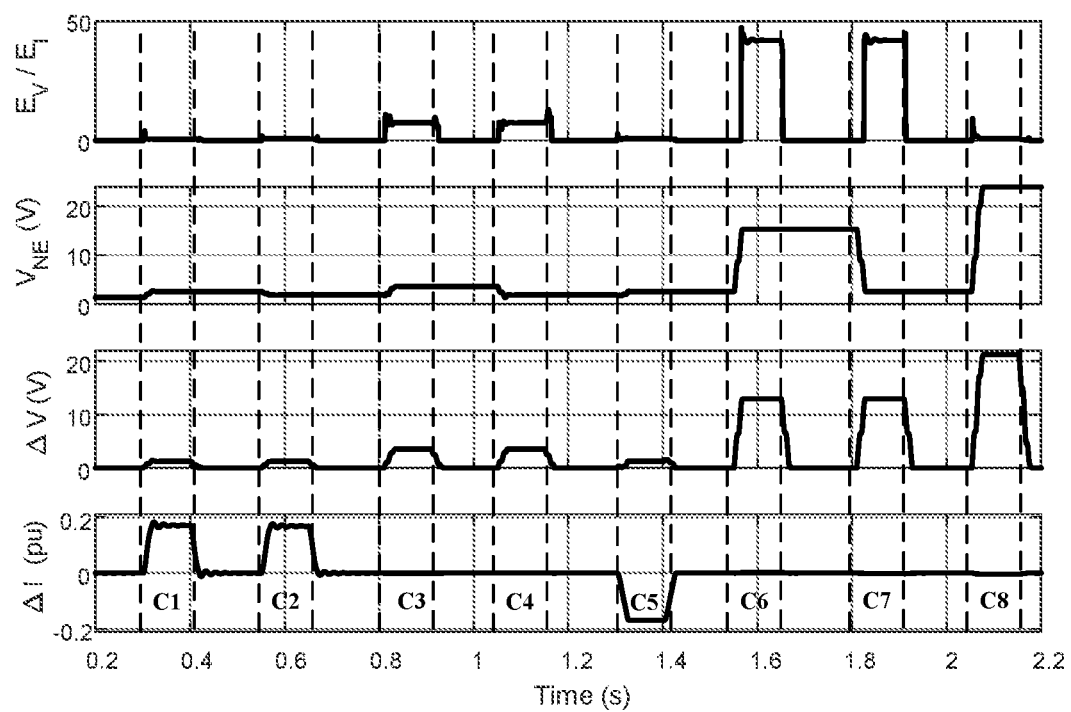
FIG. 5 shows variations of different parameters used for fault detection in a simulated low-voltage distribution network, consistent with one or more exemplary embodiments of the present disclosure.

FIG. 5 shows variations of different parameters used for fault detection in simulated low-voltage distribution network 400, consistent with one or more exemplary embodiments of the present disclosure. Table 1 shows values of each parameter in FIG. 5 at respective moments of each case. As shown in the table, an exemplary implementation of method 200 correctly detects faults for cases C3 (due to the broken neutral conductor of feeder $F_1$), C6 (due to the phase to ground short circuit in feeder $F_1$) and C8 (due to the loss of neutral fault in the entire simulated low-voltage distribution network 400). No fault is detected for other cases by an exemplary implementation of method 200 based on the calculated values in Table 1. Therefore, an exemplary implementation of method 200 shows a stable performance for normal operating conditions of simulated low-voltage distribution network 400.

TABLE 1

Fault detection in a simulated low-voltage distribution network based on different parameter electrical parameters of the network

| | Operation of proposed algorithm | | | | |
| --- | --- | --- | --- | --- | --- |
| Adjusted thresholds | $|\Delta I_1|$ (pu) 0.2 | $\Delta V$ (V) 10 | $V_{NE}$ (V) 17.5 | $|E_V/E_I|$ 2 | Case |
| No operation | 0.167 | 0.97 | 2.24 | 0.51 | C1 |
| No operation | 0.164 | 0.98 | 1.73 | 0.66 | C2 |
| Fault detection according to the first condition | 0.0003 | 3.48 | 3.91 | 7.5 | C3 |
| No operation | 0.166 | 0.99 | 2.23 | 0.67 | C5 |
| Fault detection according to the first and the third conditions | 0.002 | 13.0 | 15.1 | 43.3 | C6 |
| Fault detection according to the second and the third conditions | 0.004 | 21.24 | 23.83 | 0.8 | C8 |

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for protecting a low-voltage distribution network comprising a low-voltage side of a three-phase distribution transformer configured to supply electrical power to at least one single-phase load through a respective distribution line of a plurality of three-phase distribution lines, the method comprising:
   measuring, utilizing a numerical relay, variations of a periodic neutral-to-ground voltage between a neutral terminal of the three-phase distribution transformer and a local ground node by sampling the variations at a sampling frequency;
   detecting, utilizing one or more processors of the numerical relay, a fault in the low-voltage distribution network, comprising:
      performing an iterative measurement procedure on the low-voltage distribution network responsive to the variations of the periodic neutral-to-ground voltage being larger than a variation threshold by performing each iteration of the iterative measurement procedure M times at each respective period of the periodic neutral-to-ground voltage where $$M = \frac{F_s}{F_v}$$

where $F_v$ is a frequency of the periodic neutral-to-ground voltage and $F_s$ is the sampling frequency; and
      detecting the fault responsive to the iterative measurement procedure satisfying a fault condition for a predefined number of iterations of the iterative measurement procedure; and
   disconnecting, utilizing the numerical relay, the low-voltage side of the three-phase distribution transformer from the low-voltage distribution network responsive to the fault being detected.

2. The method of claim 1, wherein measuring the variations of the periodic neutral-to-ground voltage comprises:
   measuring a first voltage phasor of the periodic neutral-to-ground voltage at a first moment, the first voltage phasor comprising a first voltage amplitude and a first voltage phase;
   measuring a second voltage phasor of the periodic neutral-to-ground voltage at a second moment after the first moment, the second voltage phasor comprising a second voltage amplitude and a second voltage phase;
   obtaining, utilizing the one or more processors, a first compensated voltage phase by compensating the first voltage phase according to a phase of a positive sequence component associated with electric currents flowing through the plurality of three-phase distribution lines;
   obtaining, utilizing the one or more processors, a second compensated voltage phase by compensating the second voltage phase according to the phase of the positive sequence component; and
   obtaining, utilizing the one or more processors, the variations of the periodic neutral-to-ground voltage according to an operation defined by the following:

$$\overline{\Delta V_{NE\text{-}pu}} = \frac{\overline{V_{NE2}} - \overline{V_{NE1}}}{0.5 \times (V_{NE1} + V_{NE2})} \times 100$$

where:
   $\overline{\Delta V_{NE\text{-}pu}}$ represents the variations of periodic neutral-to-ground voltage,
   $\overline{V_{NE1}} = V_{NE1} \angle \phi_{NE1}$ where $V_{NE1}$ is the first voltage amplitude, $\angle$ is the angle symbol, and $\phi_{NE1}$ is the first compensated voltage phase, and
   $\overline{V_{NE2}} = V_{NE2} \angle \phi_{NE2}$ where $V_{NE2}$ is the second voltage amplitude and $\phi_{NE2}$ is the second compensated voltage phase.

3. The method of claim 2, wherein measuring the second voltage phasor at the second moment comprises measuring the second voltage phasor after at least 10 temporal periods of the periodic neutral-to-ground voltage from the first moment.

4. The method of claim 2, wherein performing each iteration of the iterative measurement procedure comprises:
   measuring, utilizing the numerical relay, a third voltage phasor of the periodic neutral-to-ground voltage at a third moment in a respective period of the periodic neutral-to-ground voltage, the third voltage phasor comprising a third voltage amplitude and a third voltage phase;
   obtaining a third compensated voltage phase by compensating the third voltage phase according to the phase of the positive sequence component;
   obtaining a relative voltage change according to an operation defined by the following:

$$E_V = \frac{\overline{V_{NE3}} - \overline{V_{NE1}}}{0.5 \times (V_{NE1} + V_{NE3})} \times 100$$

where:
   $E_V$ is the relative voltage change, and
   $\overline{V_{NE3}} = V_{NE3} \angle \phi_{NE3}$ where $V_{NE3}$ is the third voltage amplitude and $\phi_{NE3}$ is the third compensated voltage phase;
   measuring, utilizing the numerical relay, a first current phasor of a neutral electric current passing through a neutral conductor of the three-phase distribution transformer at the first moment, the first current phasor comprising a first current amplitude and a first current phase;
   measuring, utilizing the numerical relay, a second current phasor of the neutral electric current at the third moment, the second current phasor comprising a second current amplitude and a second current phase;
   obtaining a first compensated current phase by compensating the first current phase according to the phase of the positive sequence component;
   obtaining a second compensated current phase by compensating the second current phase according to the phase of the positive sequence component;
   obtaining a relative current change according to an operation defined by the following:

$$E_I = \frac{\overline{I_{NC2}} - \overline{I_{NC1}}}{0.5 \times (I_{NC1} + I_{NC2})} \times 100$$

where
$E_I$ is the relative current change,
$\overline{I_{NC1}} = I_{NC1} \angle \phi_{NC1}$ where $I_{NC1}$ is the first current amplitude and $\phi_{NC1}$ is the first compensated current phase, and
$\overline{I_{NC2}} = I_{NC2} \angle \phi_{NC2}$ where $I_{NC2}$ is the second current amplitude and $\phi_{NC2}$ is the second compensated current phase;
obtaining, utilizing the one or more processors, a first amplitude $I_1^{\,1}$ of the positive sequence component at the first moment; and
obtaining, utilizing the one or more processors, a second amplitude $I_1^{\,2}$ of the positive sequence component at the third moment.

5. The method of claim 4, wherein satisfying the fault condition comprises satisfying one of:
a first condition comprising $|E_I| > 3\%$ and $$\left|\frac{E_V}{E_I}\right| > 2;$$

and
a second condition comprising $V_{NE3} > V_{th1}$ where $V_{th1}$ an amplitude threshold for the periodic neutral-to-ground voltage; and
a third condition comprising $|V_{NE3} - V_{NE1}| > V_{th2}$ and $|I_1^{\,2} - I_1^{\,1}| < I_{th}$ where $V_{th2}$ is a current change threshold and $I_{th}$ is a current change threshold.

6. The method of claim 5, wherein detecting the fault further comprises:
setting the variation threshold to 5%;
setting the amplitude threshold to 0.7 of a largest permissible amplitude of the periodic neutral-to-ground voltage;
setting the voltage change threshold to 0.4 of the largest permissible amplitude of the periodic neutral-to-ground voltage;
setting the current change threshold to 0.2 of a rated current of the three-phase distribution transformer; and
setting the predefined number of iterations to 3M/2.

7. The method of claim 4, wherein each of compensating the first voltage phase, compensating the second voltage phase, compensating the third voltage phase, compensating the first current phase, and compensating the second current phase comprises:
measuring, utilizing the numerical relay, a first electric current passing through a first distribution line of the plurality of three-phase distribution lines;
measuring, utilizing the numerical relay, a second electric current passing through a second distribution line of the plurality of three-phase distribution lines;
measuring, utilizing the numerical relay, a third electric current passing through a third distribution line of the plurality of three-phase distribution lines;
calculating the positive sequence component according to an operation defined by the following:

$$I_1 = \frac{I_A + \alpha I_B + \alpha^2 I_C}{3}$$

where:
$\overline{I_1}$ is a phasor of the positive sequence component,
$\overline{I_A}$ is a phasor of the first electric current, $$\alpha = e^{j\frac{2\pi}{3}}$$

where j is the imaginary unit,
$\overline{I_B}$ is a phasor of the second electric current, and
$\overline{I_C}$ a phasor of is the third electric current; and
calculating each of the first compensated voltage phase, the second compensated voltage phase, and third compensated voltage phase, the first compensated current phase, and the second compensated current phase according to an operation defined by the following:

$$\phi_{NE} = \phi_{NE0} - \phi_{I1}$$

where
$\phi_{NE0}$ represents each of the first voltage phase, the second voltage phase, the third voltage phase, the first current phase, the second current phase,
$\phi_{I1}$ is the phase of the positive sequence component, and
$\phi_{NE}$ is a compensated phase corresponding to $\phi_{NE0}$.

8. The method of claim 7, wherein:
measuring the first electric current comprises reducing a level of the first electric current utilizing a first current transformer;
measuring the second electric current comprises reducing a level of the second electric current utilizing a second current transformer;
measuring the third electric current comprises reducing a level of the third electric current utilizing a third current transformer; and
each of measuring the first current phasor and measuring the second current phasor comprises reducing a level of the neutral electric current utilizing a fourth current transformer.

9. The method of claim 1, further comprising:
performing, utilizing the one or more processors, the iterative measurement procedure for a period of at least 200 ms responsive to the low-voltage side of the three-phase distribution transformer being disconnected; and
disconnecting, utilizing the numerical relay, a high-voltage side of the three-phase distribution transformer responsive to the iterative measurement procedure satisfying the fault condition during the period of at least 200 ms.

10. A system for protecting a low-voltage distribution network comprising a low-voltage side of a three-phase distribution transformer configured to supply electrical power to at least one single-phase load through a respective distribution line of a plurality of three-phase distribution lines, the system comprising:
a memory having processor-readable instructions stored therein; and
a numerical relay coupled to the three-phase distribution transformer, the numerical relay comprising one or more processors configured to access the memory and execute the processor-readable instructions, which, when executed by the one or more processors configures the one or more processors to perform a method, the method comprising:
measuring, utilizing the numerical relay, variations of a periodic neutral-to-ground voltage between a neutral terminal of the three-phase distribution transformer and a local ground node by sampling the variations at a sampling frequency;

performing an iterative measurement procedure on the low-voltage distribution network responsive to the variations of the periodic neutral-to-ground voltage being larger than a variation threshold by performing each iteration of the iterative measurement procedure M times at each respective period of the periodic neutral-to-ground voltage where $$M = \frac{F_s}{F_v}$$

where $F_v$ is a frequency of the periodic neutral-to-ground voltage and $F_s$ is the sampling frequency;

detecting a fault in the low-voltage distribution network responsive to the iterative measurement procedure satisfying a fault condition for a predefined number of iterations of the iterative measurement procedure;

disconnecting, utilizing the numerical relay, the low-voltage side of the three-phase distribution transformer from the low-voltage distribution network responsive to the fault being detected;

performing the iterative measurement procedure for a period of at least 200 ms responsive to the low-voltage side of the three-phase distribution transformer being disconnected; and disconnecting, utilizing the numerical relay, a high-voltage side of the three-phase distribution transformer responsive to the iterative measurement procedure satisfying the fault condition during the period of at least 200 ms.

11. The system of claim 10, wherein measuring the variations of the periodic neutral-to-ground voltage comprises:

measuring a first voltage phasor of the periodic neutral-to-ground voltage at a first moment, the first voltage phasor comprising a first voltage amplitude and a first voltage phase;

measuring a second voltage phasor of the periodic neutral-to-ground voltage at a second moment after at least 10 temporal periods of the periodic neutral-to-ground voltage from the first moment, the second voltage phasor comprising a second voltage amplitude and a second voltage phase;

obtaining a first compensated voltage phase by compensating the first voltage phase according to a phase of a positive sequence component associated with electric currents flowing through the plurality of three-phase distribution lines;

obtaining a second compensated voltage phase by compensating the second voltage phase according to the phase of the positive sequence component; and obtaining the variations of the periodic neutral-to-ground voltage according to an operation defined by the following:

$$\overline{\Delta V_{NE\text{-}pu}} = \frac{\overline{V_{NE2}} - \overline{V_{NE1}}}{0.5 \times (V_{NE1} + V_{NE2})} \times 100$$

where:

$\overline{\Delta V_{NE\text{-}pu}}$ represents the variations of periodic neutral-to-ground voltage, $\overline{V_{NE1}} = V_{NE1} \angle \phi_{NE1}$ where $V_{NE1}$ is the first voltage amplitude, $\angle$ is the angle symbol, and $\phi_{NE1}$ is the first compensated voltage phase, and $\overline{V_{NE2}} = V_{NE2} \angle \phi_{NE2}$ where $V_{NE2}$ is the second voltage amplitude and $\phi_{NE2}$ is the second compensated voltage phase.

12. The system of claim 11, wherein performing each iteration of the iterative measurement procedure comprises:

measuring, utilizing the numerical relay, a third voltage phasor of the periodic neutral-to-ground voltage at a third moment in a respective period of the periodic neutral-to-ground voltage, the third voltage phasor comprising a third voltage amplitude and a third voltage phase;

obtaining a third compensated voltage phase by compensating the third voltage phase according to the phase of the positive sequence component;

obtaining a relative voltage change according to an operation defined by the following:

$$E_V = \frac{\overline{V_{NE3}} - \overline{V_{NE1}}}{0.5 \times (V_{NE1} + V_{NE3})} \times 100$$

where:

$E_V$ is the relative voltage change, and $\overline{V_{NE3}} = V_{NE3} \angle \phi_{NE3}$ where $V_{NE3}$ is the third voltage amplitude and $\phi_{NE3}$ is the third compensated voltage phase;

measuring, utilizing the numerical relay, a first current phasor of a neutral electric current passing through a neutral conductor of the three-phase distribution transformer at the first moment, the first current phasor comprising a first current amplitude and a first current phase;

measuring, utilizing the numerical relay, a second current phasor of the neutral electric current at the third moment, the second current phasor comprising a second current amplitude and a second current phase;

obtaining a first compensated current phase by compensating the first current phase according to the phase of the positive sequence component;

obtaining a second compensated current phase by compensating the second current phase according to the phase of the positive sequence component;

obtaining a relative current change according to an operation defined by the following:

$$E_I = \frac{\overline{I_{NC2}} - \overline{I_{NC1}}}{0.5 \times (I_{NC1} + I_{NC2})} \times 100$$

where:

$E_I$ is the relative current change, $\overline{I_{NC1}} = I_{NC1} \angle \phi_{NC1}$ where $I_{NC1}$ is the first voltage amplitude and $\phi_{NC1}$ is the first compensated voltage phase, and $\overline{I_{NC2}} = I_{NC2} \angle \phi_{NC2}$ where $I_{NC2}$ is the second compensated current phase;

obtaining, utilizing the numerical relay, a first amplitude $I_1^{\,1}$ of the positive sequence component at the first moment; and obtaining, utilizing the numerical relay, a second amplitude $I_1^{\,2}$ of the positive sequence component at the third moment.

13. The system of claim 12, wherein satisfying the fault condition comprises satisfying one of:
a first condition comprising $|E_I|>3\%$ and $$\left|\frac{E_V}{E_I}\right|>2;$$

and
a second condition comprising $V_{NE3}>V_{th1}$ where $V_{th1}$ of a largest permissible amplitude of the periodic neutral-to-ground voltage; and
a third condition comprising $|V_{NE3}-V_{NE1}|>V_{th2}$ and $|I_1^2-I_1^1|<I_{th}$ where $V_{th2}$ is to 0.4 of the largest permissible amplitude of the periodic neutral-to-ground voltage and $I_{th}$ is 0.2 of a rated current of the three-phase distribution transformer.

14. The system of claim 12, wherein each of compensating the first voltage phase, compensating the second voltage phase, compensating the third voltage phase, compensating the first current phase, and compensating the second current phase comprises:
measuring, utilizing the numerical relay, a first electric current passing through a first distribution line of the plurality of three-phase distribution lines;
measuring, utilizing the numerical relay, a second electric current passing through a second distribution line of the plurality of three-phase distribution lines;
measuring, utilizing the numerical relay, a third electric current passing through a third distribution line of the plurality of three-phase distribution lines;
calculating the positive sequence component according to an operation defined by the following:

$$I_1 = \frac{I_A + \alpha I_B + \alpha^2 I_C}{3}$$

where:
$\overline{I_1}$ is a phasor of the positive sequence component,
$\overline{I_A}$ is a phasor of the first electric current, $$\alpha = e^{j\frac{2\pi}{3}}$$

where j is the imaginary unit,
$\overline{I_B}$ is a phasor of the second electric current, and
$\overline{I_C}$ a phasor of is the third electric current; and
calculating each of the first compensated voltage phase, the second compensated voltage phase, and third compensated voltage phase, the first compensated current phase, and the second compensated current phase according to an operation defined by the following:

$$\phi_{NE}=\phi_{NE0}-\phi_{I1}$$

where
$\phi_{NE0}$ represents each of the first voltage phase, the second voltage phase, the third voltage phase, the first current phase, the second current phase,
$\phi_{I1}$ is the phase of the positive sequence component, and
$\phi_{NE}$ is a compensated phase corresponding to $\phi_{NE0}$.

* * * * *